(12) United States Patent
De Boer et al.

(10) Patent No.: US 10,539,730 B2
(45) Date of Patent: Jan. 21, 2020

(54) LIGHT SOURCE WITH DIFFRACTIVE OUTCOUPLING

(71) Applicant: SIGNIFY HOLDING B.V., Eindhoven (NL)

(72) Inventors: Dirk Kornelis Gerhardus De Boer, Eindhoven (NL); Marcus Antonius Verschuuren, Eindhoven (NL); Anne Souren, Eindhoven (NL); Hendrik Johannes Boudewijn Jagt, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/759,954

(22) PCT Filed: Apr. 26, 2016

(86) PCT No.: PCT/EP2016/059220
§ 371 (c)(1),
(2) Date: Mar. 14, 2018

(87) PCT Pub. No.: WO2017/054937
PCT Pub. Date: Apr. 6, 2017

(65) Prior Publication Data
US 2018/0252855 A1    Sep. 6, 2018

(30) Foreign Application Priority Data
Sep. 29, 2015  (EP) ..................... 15187285

(51) Int. Cl.
*H01L 33/50*  (2010.01)
*F21V 8/00*  (2006.01)
(Continued)

(52) U.S. Cl.
CPC ....... *G02B 6/0003* (2013.01); *G02B 19/0009* (2013.01); *G02B 19/0066* (2013.01);
(Continued)

(58) Field of Classification Search
CPC .... G02B 6/005; G02B 6/0035; G02B 6/0053; G02B 6/045; H01L 33/505
(Continued)

(56) References Cited

U.S. PATENT DOCUMENTS 7,982,229 B2     7/2011  Bechtel et al.
8,761,565 B1 *  6/2014  Coleman ................ F21V 5/002
                                                               362/335
(Continued)

FOREIGN PATENT DOCUMENTS

EP          1815532 B1    6/2008
WO     WO2007031929 A1    3/2008
(Continued)

*Primary Examiner* — Andrew J Coughlin
(74) *Attorney, Agent, or Firm* — Akarsh P. Belagodu

(57) ABSTRACT

An illumination device comprising a plurality of solid state light sources and a concentrating wave length converter arranged to inject light from said light sources through at least one entrance surface and to extract wave length converted light from at least one exit surface, comprising a structured layer provided on said exit surface, said structured layer having a structure period less than 5 micrometers, thereby enabling out-coupling through the exit surface by a combination of refraction and diffraction. In a situation where the angle of incidence on a surface is within a limited range, a combination of refraction and diffraction may provide a superior out-coupling from that surface.

15 Claims, 3 Drawing Sheets

(51) Int. Cl.
    *H01L 25/075* (2006.01)
    *G02B 19/00* (2006.01)
    *F21Y 115/10* (2016.01)
    *G03B 21/20* (2006.01)

(52) U.S. Cl.
    CPC ........ *H01L 25/0753* (2013.01); *H01L 33/505* (2013.01); *F21Y 2115/10* (2016.08); *G02B 6/0053* (2013.01); *G02B 6/0068* (2013.01); *G03B 21/204* (2013.01)

(58) Field of Classification Search
    USPC ....................................................... 362/555
    See application file for complete search history.

(56) References Cited

U.S. PATENT DOCUMENTS

| | | |
|---|---|---|
| 2007/0070477 A1 | 3/2007 | Eto et al. |
| 2007/0145883 A1* | 6/2007 | Ohashi .................... H01L 33/20 313/498 |
| 2007/0196939 A1 | 8/2007 | Park et al. |
| 2007/0284991 A1* | 12/2007 | Egi ........................ C09K 11/06 313/479 |
| 2008/0180026 A1* | 7/2008 | Kondo .................... G02B 5/045 313/506 |
| 2008/0224160 A1 | 9/2008 | Chang et al. |
| 2010/0230698 A1 | 9/2010 | Rode et al. |
| 2013/0228813 A1 | 9/2013 | Jo et al. |
| 2014/0043856 A1 | 2/2014 | Thompson et al. |
| 2015/0003106 A1 | 1/2015 | Thompson et al. |
| 2015/0029748 A1 | 1/2015 | Yokota et al. |
| 2015/0098243 A1 | 4/2015 | Li et al. |

FOREIGN PATENT DOCUMENTS

| | | |
|---|---|---|
| WO | WO2014155250 A1 | 10/2014 |
| WO | WO2015036224 A1 | 3/2015 |

* cited by examiner

LIGHT SOURCE WITH DIFFRACTIVE OUTCOUPLING

CROSS-REFERENCE TO PRIOR APPLICATIONS

This application is the U.S. National Phase application under 35 U.S.C. § 371 of International Application No. PCT/EP2016/059220, filed on Apr. 26, 2016, which claims the benefit of European Patent Application No. 15187285.0, filed on Sep. 29, 2015. These applications are hereby incorporated by reference herein.

FIELD OF THE INVENTION

The invention relates to an illumination device comprising a plurality of solid state light sources and a concentrating wave length converter arranged to inject light from said light sources through at least one entrance surface and to extract wave length converted light from at least one exit surface.

BACKGROUND OF THE INVENTION

Solid state light sources, such as LEDs, have been established as an energy efficient alternative to conventional light sources. In some high power applications, e.g. spot lights and image projection, it has been proposed to couple light from several light sources (e.g. LEDs) into one common wave length converter referred to as a concentrator. Light of a longer wavelength can then be extracted from just one surface of the concentrator, which increases the intensity of the light emitted, whereas the etendue of the light source can remain small. Document U.S. Pat. No. 7,982,229 describes a conversion structure comprising luminescent concentrator which receives light from blue LEDs, converts the light into longer-wavelength light and guides it to an exit surface, where the resulting brightness can be high.

A problem with such luminescent concentrators is effective out-coupling. If the refractive index of the converter is n=1.8, the critical angle for total internal reflection (TIR) with respect to air is 34 degrees, so that light with this or larger angle of incidence with respect to the normal to the side surfaces will be guided by TIR to the exit surface. However, if the exit surface is perpendicular to the side surfaces, much of this light (in fact, all light with an angle of incidence at the side surface smaller than 56 degrees) will have an angle of incidence at the exit surface greater than 34 degrees and will be reflected again at the exit surface. This means that light with incidence angles at the side surfaces between 34 degrees and 56 degrees will be reflected eternally in a perfect converter.

A well-known extraction structure is the compound parabolic concentrator (CPC), which can extract nearly all light. A disadvantage of such a device is that it is cumbersome to attach it to the luminescent concentrator rod and mechanically instable. Another issue when using a CPC is that the étendue is enlarged by a factor $n^2$ (where n is the refractive index of the CPC material). This means that, for a given étendue of the application (e.g. projector), the rod should be made smaller, which in turn means that it is more difficult to accommodate enough LEDs at the sides and leads to additional bottlenecks such as thermal limits due to the reduced cooling area.

As shown in U.S. Pat. No. 7,982,229, microscopic structures like lenses or pyramids or a rough structure on the exit surface will extract more light than an unstructured surface. Such structures will reflect light that cannot exit into directions that might give rise to escape after going round by reflection to the other surfaces. However, still a large amount of light (up to 40%) will not escape from the converter.

SUMMARY OF THE INVENTION

It is an object of the present invention to mitigate this problem, and to provide an illumination device with a concentrating wavelength converter with improved out-coupling.

According to a first aspect of the invention, this and other objects are achieved by an illumination device comprising a plurality of solid state light sources and a concentrating wave length converter arranged to inject light from the light sources through at least one entrance surface and to extract wave length converted light from at least one exit surface, wherein the wave length converter is configured to provide total internal reflection (TIR) of converted light when an incidence angle at a side surface is between A and 90 degrees, where the angle A is determined by the refractive index of the converter and the surrounding media, respectively, and wherein the geometry of the wave length converter is such that an incidence angle of converted light at the exit surface, after reflection in the side surface, is in a range including angles greater than A, and wherein a structured layer is provided on the exit surface, the structured layer having a structure period less than 5 micrometers, thereby enabling out-coupling through the exit surface by a combination of refraction and diffraction.

The angle A will depend on the refractive index of the converter material ($n_{conv}$) and the refractive index of the surrounding medium ($n_{surr}$) according to $A = a\sin(n_{surr}/n_{conv})$. The angle A is typically between 20 and 40 degrees, and as an example, if the refractive index of the converter is n=1.8 and the surrounding medium is air (with n=1), the critical angle A will be 34 degrees.

A portion of the light incident on the exit surface will have an angle of incidence greater than A, and will thus fulfill the TIR conditions. In a conventional concentrator, this light would be trapped inside the concentrator. According to the invention, however, at least a portion of this light may be out-coupled by diffraction. The mechanism for improved extraction by these structures is that light that would be in total internal reflection otherwise now partly can escape by diffraction. Note that this is different from the case with macroscopic structures that rely on refraction only, for which the improved extraction is based on recycling in the rod.

It is noted that the use of diffractive surfaces for out-coupling is not novel per se, and indeed has been used in many applications. As an example, document US 2013/0228813 discloses a light emitting device comprising a fluorescent layer formed on the light emitting surface of a LED, and a light extraction layer formed on the fluorescent layer. However, as the fluorescent layer is in direct contact with the LED, there is no limitation in the angular spread of light, and diffraction is a logical choice. In a situation where the angular spread is restricted, like in the present invention, refraction has always been the natural choice and diffraction has not been considered.

However, the invention is based on the realization that in a situation where the angle of incidence on a surface is within a limited range, a combination of refraction and diffraction may provide a superior out-coupling from that surface. Tests indicate that for a typical concentrator, approximately 45% more light may be extracted from the exit surface compared to a conventional concentrator.

In some embodiments, the exit surface is normal to the side surface so that the incidence angle of converted light at said exit surface, after reflection in the side surface, is between zero and 90−A degrees, wherein A is less than 45 degrees. This means that at least a portion of the light incident on the exit surface will have an angle of incidence greater than A, and this fulfill TIR conditions.

The converter may have a rectangular cross section, but may also have a cross section with the same shape and aspect ratio as an area to be illuminated.

The refractive index of the material forming the structured layer is equal to or greater than $n_{conv}-0.3$, where $n_{conv}$ is the index of refraction of the material forming the wavelength converter. The index of refraction of the material forming the structured layer is preferably equal to or greater than $n_{conv}-0.2$, more preferable equal to or greater than $n_{conv}-0.1$. Even more preferably, a difference between an index of refraction of the structured layer and the index of refraction of the wavelength converter is equal to or less than 0.1, or that the respective refractive indexes are equal. In case the refractive index of the material forming the structured layer is much lower than that of the luminescent material, converted light with certain angles of incidence cannot enter the structured layer because of TIR at the interface of the wavelength converter and the structured layer, and hence cannot be outcoupled; in other words reflection in an interface between the wavelength converter and the structured layer is avoided. Furthermore, the index of refraction of the material of the structured layer is preferably not much higher than the index of refraction of the wavelength converter, because otherwise Fresnel reflection at the interface between the wavelength converter and the structured layer diminishes the amount of light that can enter the structured layer.

The structured layer may be formed by a sol-gel material containing high-index nano-particles. Alternatively, the structured layer may be formed by a transparent polymer containing high-index nano-particles. In this case, the transparent polymer may be a silicone. When modified with nano-particles, a high index silicone layer may be more stable than nano-particles contained in regular organic polymers. Also, a silicone based material is not as sensitive to layer thickness and related cracking effects, meaning that relatively thick and flexible layers can be replicated.

A method for manufacturing a concentrating wavelength converter comprising the steps of providing a precursor material, applying the precursor material as a coating on a stamp provided with an inverse structure having a structure period less than 5 micrometers, arranging at least one rod of luminescent material on the precursor coating, allowing the precursor coating to react and/or dry, removing the rod from the stamp, and heating the rod above room temperature to cure the precursor material. The precursor material may be a sol-gel material or a silicone precursor material, and may include high index nano-particles.

The method is an efficient way to manufacture the structured layer according to the first aspect of the invention.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1:
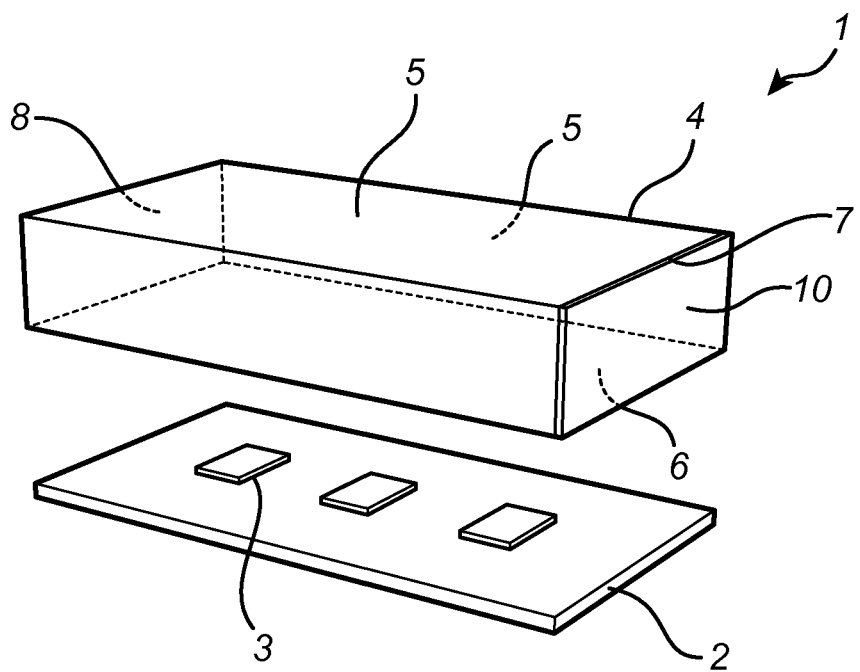
FIG. 1 schematically shows an illumination device according to an embodiment of the present invention.

FIG. 1 is a perspective view of a light emitting device 1 according to an embodiment of the invention, the light emitting device 1 comprises a substrate 2, such as a PCB, carrying a plurality (here three) solid state light sources 3, and a concentrating wavelength converter 4.

The solid state light source may be a Light Emitting Diode (LED), a Laser Diode or Organic Light Emitting Diode (OLED), a plurality of LEDs or Laser Diodes or OLEDs or an array of LEDs or Laser Diodes or OLEDs. The LED may in principle be an LED of any color, and is in an embodiment a blue light source producing light source light in the blue color-range which is defined as a wavelength range of between 380 nm and 495 nm.

The wavelength converter is made of a luminescent material. The wavelength converter may comprise either Ce doped Yttrium aluminum garnet (YAG, $Y_3Al_5O_{12}$), YGdAG, YGaAG, Lutetium Aluminum-Garnet (LuAG), LuGaAG or LuYAG. YAG, YGdAG, YGaAG, LuAG, LuGaAG and LuYAG are able to have refractive indexes in the preferred ranges and also convert light, hence they may be used for the wavelength converter.

The wavelength converter 4 is typically rod-shaped with a length greater than its width and height. In FIG. 1, the cross section is rectangular, but the cross section may also have any other suitable shape, in particular it may have the same shape and aspect ratio as an area to be illuminated. The length may be in the order of tens of millimeters, while the height and width may be in the order of millimeters. As an example, the dimensions may be 50×2×1 mm. The converter rod 4 has an envelope surface, here formed by four side surfaces 5, one of which is also referred to as a light entrance surface 6, and two end surfaces 8, one of which is referred to as a light exit surface 7. In the illustrated example, the LEDs 3 are arranged at an optical distance suitable to inject light into the converter 4.

Further examples of suitable LEDs and material for converters are described in more detail in WO 2014/155250, hereby incorporated by reference.

In use, the LEDs 3 mounted on the substrate 2 will emit light of a first wavelength which will be coupled or injected into the wavelength converter 4 through the light entrance surface 6. At least a portion of the light of a first wavelength injected into the wavelength converter 4 will be converted into light of a second wavelength, and after the conversion process it will be emitted in a random direction. The portion of converted light and a portion which may not have been converted will impinge on a surface 5 forming an interface between the wavelength converter 4 and a surrounding medium (e.g. air). Due to low surface roughness of the surface 5, the light impinging at the side surfaces will have a large likelihood of TIR and thereby of being reflected back into the wavelength converter 4. Eventually, light will be directed towards the light exit surface 7, where it is intended to be out-coupled or extracted.

As explained briefly above, the index of refraction of the material forming the wavelength converter ($n_{conv}$) and the refractive index of the surrounding medium ($n_{surr}$) will define an angle A=a sin ($n_{surr}/n_{conv}$). The surfaces 5, 8 of the converter rod 4 will provide total internal reflection (TIR) of converted light when an incidence angle at a side surface is between A and 90 degrees. Further, the geometry of the wave length converter, and more specifically the orientation of the exit surface 7 in relation to the envelope surface 5, is such that an incidence angle of converted light at the exit surface 7, after reflection in a side surface 5, is in a range including angles greater than A. In a typical case, illustrated in FIG. 1, where the exit surface 7 is perpendicular to the side surfaces 5, the range of incident angles at the exit surface 7 will be between 0 and 90–A degrees.

Figure 2:
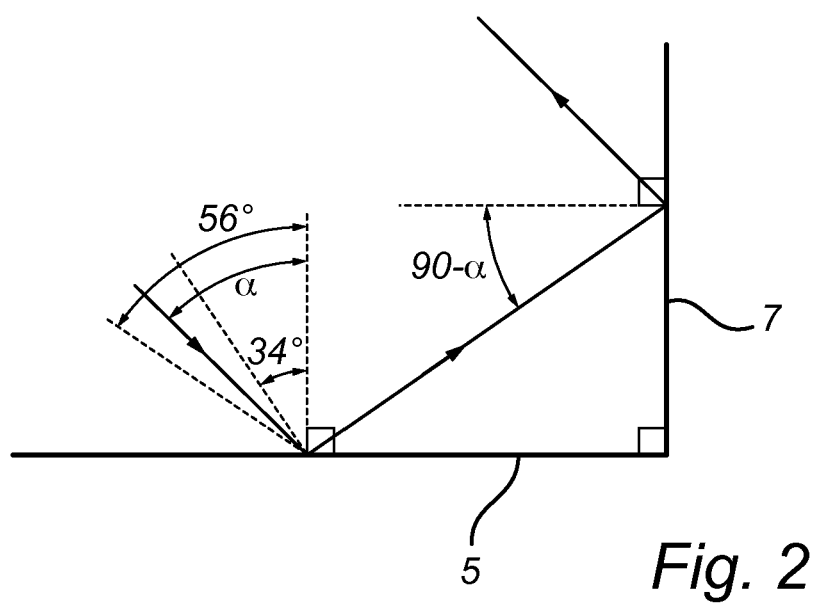
FIG. 2 shows total internal reflection (TIR) within a wave guide.

In a case where the angle A is less than 45 degrees some light will be trapped in an eternal TIR, bouncing between the side surfaces 5, the exit surface 7 and the opposite end surface 8. FIG. 2 illustrates this situation for an example where $n_{conv}$=1.8, $n_{surr}$=1 and A=34 degrees. In this case, any light with an angle of incidence a between A=34 degrees and 90–A=56 degrees will have an angle of incidence 90-α at the exit surface in the range between 34 and 56 degrees, thus fulfilling the TIR conditions.

According to the invention, a structured layer 10 is provided on the exit surface 7, which structured layer has a structure period less than 5 micrometers, thereby enabling out-coupling through the exit surface by a combination of refraction and diffraction.

The refractive index of the material forming the structured layer 10 is equal to or greater than $n_{conv}$–0.3, where $n_{conv}$ is the index of refraction of the material forming the wavelength converter 4. The index of refraction of the material forming the structured layer is preferably equal to or greater than $n_{conv}$–0.2. The index of refraction of the material forming the structured layer is more preferably equal to or greater than $n_{conv}$–0.1. Even more preferably, a difference between an index of refraction of the structured layer and the index of refraction of the wavelength converter is equal to or less than 0.1

The diffractive structured layer may be made of a transparent material containing nano-particles. By combining high index and low index nano-particles, or high index nano-particles in a low index binder, the refractive index of the structured layer may be adjusted to a desired value, including to be close to $n_{conv}$. By "high-index" particles are intended particles with an index of refraction substantially greater than $n_{conv}$. Examples include particles of $ZrO_2$, $TiO_2$, $BaTiO_3$, $SrTiO_3$, and $HfO_2$. By "low-index" particles are intended particles with an index of refraction substantially smaller than $n_{conv}$. Examples include particles of $SiO_2$. Examples of a low index binder, may be a siloxane, such as a silicone, or a silicate derived via sol-gel chemistry, such as a methylsilicate derived from methyltrimethoxysilane. Alternatively, the high-index particles can be surrounded by voids filled with air (n=1), or a mixture of a nano-porous, void filled, layer of high index particles, low index binder and/or low index nanoparticles.

In one embodiment, the diffractive structured layer is made of commercially available materials from Pixelligent (www.pixelligent.com), which are nano-$ZrO_2$ dispersions that can be mixed into transparent polymers, such as an epoxy, to increase the refractive index depending on the nano-particle volume concentration, up to, for instance, 1.85.

Alternatively, a silicone is used instead of regular organic polymers, such as a polydimethylsiloxane, polymethylphenylsiloxane or polydiphenylsiloxane. The sol-gel material may consist of a wide variety of materials formed in a sol-gel process, such as materials derived from alkoxides, for instance, silicon alkoxide, for instance derived from precursor materials such as alkyl-trimethoxysilanes, for instance, methyl- or ethyl- or phenyl-trimethoxysilane.

The diffractive structures may be formed using substrate conformal imprint lithography (SCIL) to replicate a proper diffractive structure into sol-gel materials (discussed below). Other options are grey-scale lithography and reactive ion etching. Replication from a (metal) master imprint/hard stamp may be another possibility or structuring by laser ablation.

Figure 3:
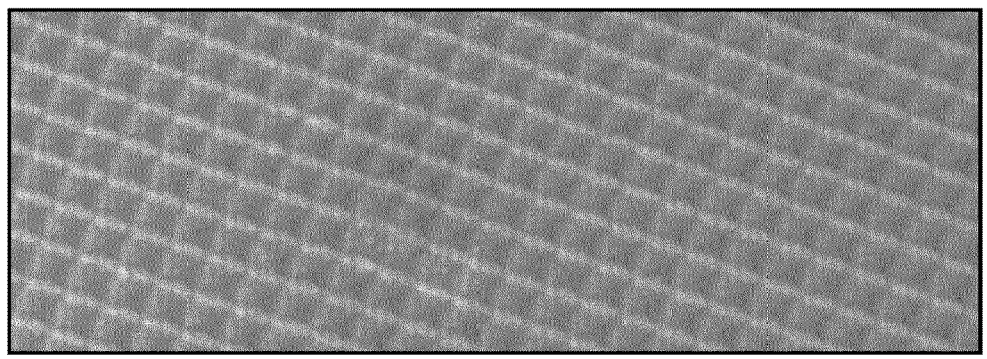
FIG. 3 is a microscope photograph of a structure with 2 nm period.
Figure 4:
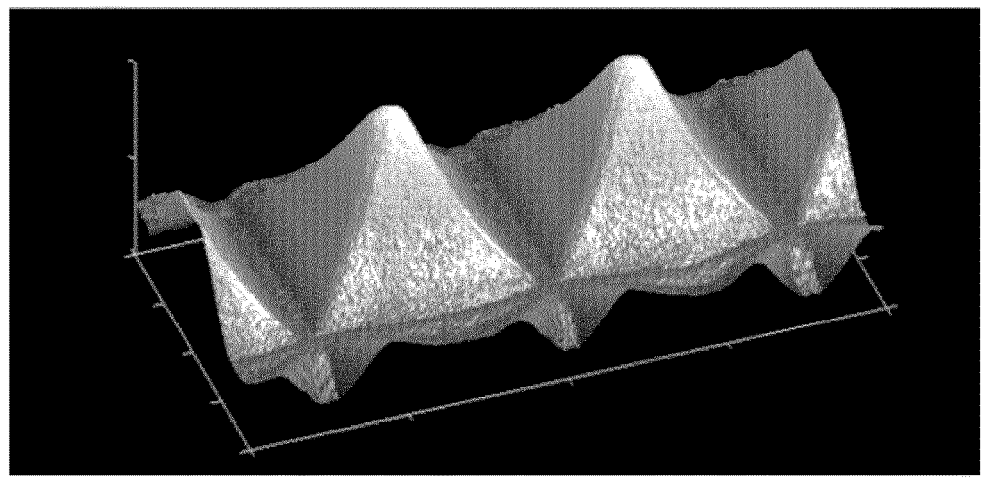
FIG. 4 is an atomic force microscope picture of a 2 μm period pyramidal structure.

With reference to FIGS. 3-5 an example of such a structured layer 10 and its application to an end surface of a concentrating converter rod 4 will be discussed. A substrate conformal imprint lithography (SCIL) stamp is provided with an inverse pattern of 2 µm base pyramids with 200 nm intermediate spaces. FIG. 3 is a microscope photograph of this structure with 2 µm period, and FIG. 4 is an atomic force microscope picture showing the pyramidal shapes with 2 µm period.

Figures 5A, 5B, 5C, 5D:
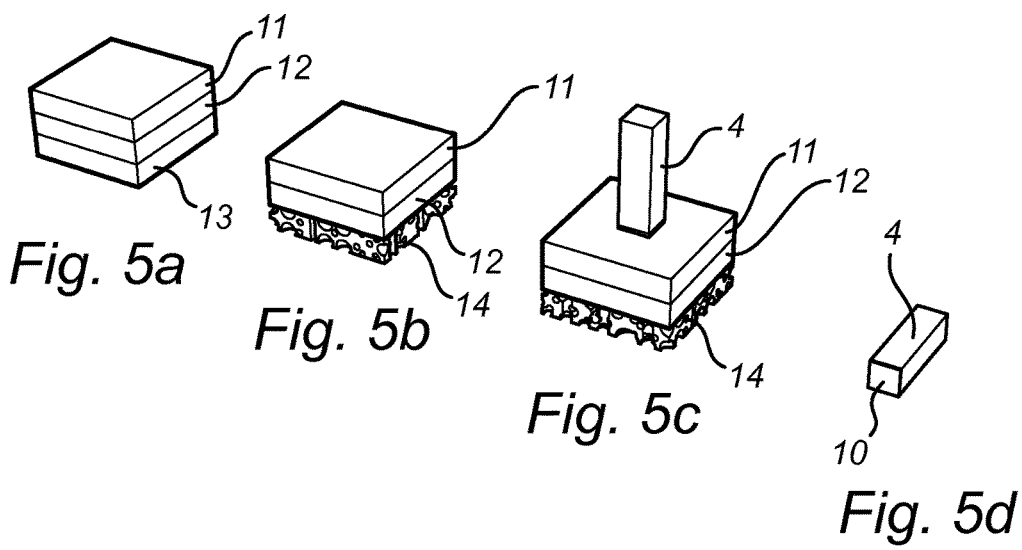
FIG. 5 schematically shows various steps of forming diffractive structures using substrate conformal imprint lithography (SCIL).

The process of forming the structure on the rod 4 by SCIL is shown in FIG. 5. A sol-gel precursor material is made of a dispersion comprising a $TiO_2$ nanoparticle suspension, stabilizers and co-solvents, adjusted to the desired pH. The $TiO_2$ dispersion 11 is applied (FIG. 5a) on the stamp 12 by spin coating (1000 rpm, 30 s), while the stamp is supported by a silicon wafer 13. Other methods, such as blade coating or spray coating may also be employed. Then (FIG. 5b), the silicon wafer 13 is removed and the stamp 12 is placed on an air-permeable support 14. Then (FIG. 5c) the rod 4 is placed on the $TiO_2$ layer 11 using a holder (not shown) and left to dry/react for 3 hours at room temperature. Finally (FIG. 5d) the rod 4 is removed and post-baked 30 minutes at 90° C. A diffractive structured layer 10 is now formed on the end of the rod 4.

Figure 6:
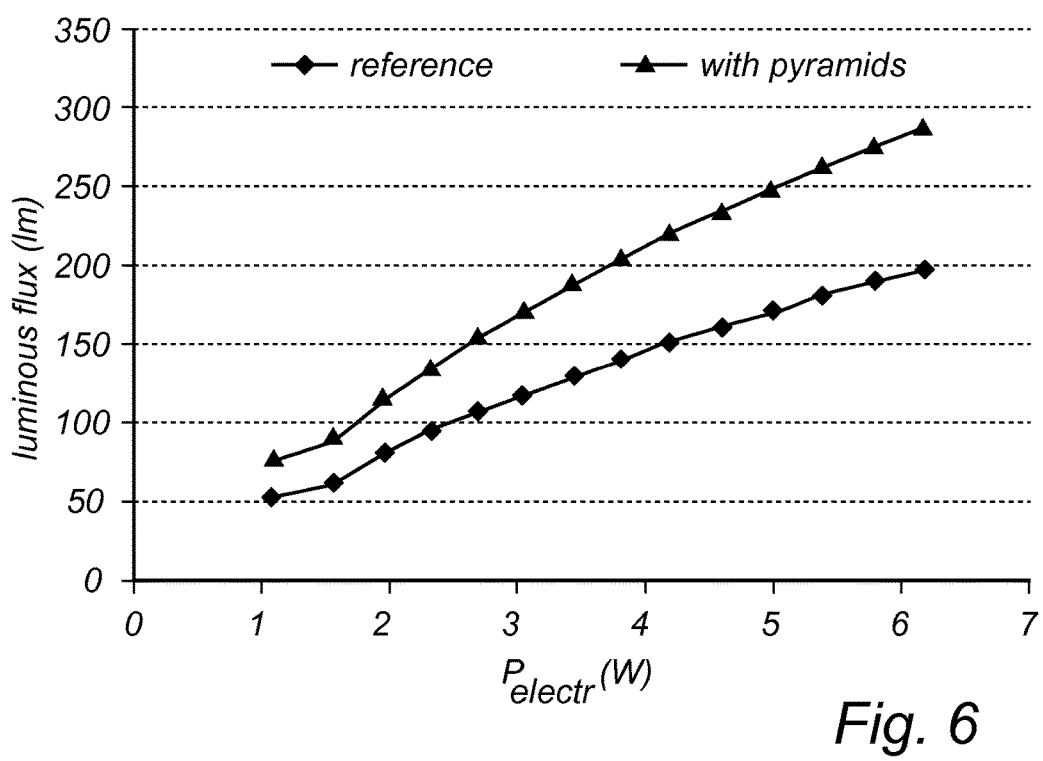
FIG. 6 is a diagram illustrating the effect of an embodiment of the present invention.

In a subsequent test, a luminescent (LuAG:Ce) rod without any structured layer was mounted in a module with blue LEDs on two sides and the light output was measured in an integrating sphere. Then, a pyramidal nano-patterned layer 10 was applied using the process described above, with the structures as shown in FIGS. 3 and 4, and the measurement repeated. The result is shown in FIG. 6, showing a plot of luminous flux measured in integrating sphere without (diamonds) and with (triangles) diffractive extraction structure with respect to input electrical power. It was found that approximately 45% more light was extracted from the rod exit surface with the diffractive structure 10 than without.

The person skilled in the art realizes that the present invention by no means is limited to the preferred embodiments described above. On the contrary, many modifications and variations are possible within the scope of the appended claims. For example, the concentrating rod may have a different size and shape. Also, it is understood that other materials and combinations of materials than those mentioned herein may be used to implement the invention.

The invention claimed is:
1. An illumination device comprising:
a plurality of solid state light sources and
a concentrating wavelength converter arranged to inject light from said light sources through at least one entrance surface and to extract wavelength converted light from at least one exit surface, wherein said wavelength converter is configured to provide total internal reflection of converted light when an incidence angle at a side surface is between an angle A and 90 degrees, where the angle A is determined by the refractive index of the converter and the surrounding media, respectively, and wherein the geometry of said wavelength converter is such that an incidence angle of converted light at said exit surface, after total internal reflection in said side surface, is in a range including angles greater than the angle A, wherein the angle A is defined as $A = a\sin(n_{surr}/n_{conv})$ where $n_{surr}$ is the index of refraction of the surrounding media of the wavelength converter and where $n_{conv}$ is the index of refraction of the material forming the wavelength converter, a structured layer provided on said exit surface, wherein said structured layer has a structure period less than 5 micrometers, so as to enable out-coupling by a combination of refraction and diffraction, and the index of refraction of the material forming said structured layer is equal to or greater than $n_{conv} - 0.3$.

2. The illumination device according to claim 1, wherein the index of refraction of the material forming said structured layer is equal to or greater than $n_{conv} - 0.1$.

3. The illumination device according to claim 1, wherein a difference between an index of refraction of the material forming said structured layer and the index of refraction of the material forming said wavelength converter is equal to or less than 0.1.

4. The illumination device according to claim 1, wherein said exit surface is normal to said side surface so that the incidence angle of converted light at said exit surface, after reflection in said side surface, is between zero and 90−A degrees, wherein the angle A is less than 45 degrees.

5. The illumination device according to claim 4, wherein the angle A is between 20 and 40 degrees.

6. The illumination device according to claim 4, wherein the angle A is between 30 and 40 degrees.

7. The illumination device according to claim 1, wherein the incidence angle of converted light at said exit surface, after total internal reflection in said side surface, is in the range of zero to 70 degrees.

8. The illumination device according to claim 1, wherein said structured layer has a structure period less than 3 micrometers.

9. The illumination device according to claim 1, wherein said structured layer is formed by a sol-gel material containing high-index nano-particles.

10. The illumination device according to claim 9, wherein the nano-particles are of selected from the group consisting of $ZrO_2$, $TiO_2$, $BaTiO_3$, $SrTiO_3$ and $HfO_2$.

11. The illumination device according to claim 1, wherein said structured layer is formed by a transparent polymer containing high-index nano-particles.

12. The illumination device according to claim 11, wherein the transparent polymer is a silicone.

13. A projector comprising an illumination device according to claim 1.

14. The illumination device of claim 1, wherein the structured layer comprises a plurality of pyramidal shapes.

15. The illumination device according to claim 1, wherein the incidence angle of converted light at said exit surface, after total internal reflection in said side surface, is in the range of zero to 70 degrees.

* * * * *